United States Patent
Locher et al.

(10) Patent No.: US 7,064,698 B2
(45) Date of Patent: Jun. 20, 2006

(54) CIRCUIT ARRANGEMENT AND METHOD FOR SIGMA-DELTA CONVERSION WITH REDUCED IDLE TONES

(75) Inventors: Matthias Locher, San Jose, CA (US); Leonardo Della Pietra, Zürich (CH)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/519,603

(22) PCT Filed: Jun. 19, 2003

(86) PCT No.: PCT/IB03/02886

§ 371 (c)(1),
(2), (4) Date: Dec. 27, 2004

(87) PCT Pub. No.: WO2004/004131

PCT Pub. Date: Jan. 8, 2004

(65) Prior Publication Data

US 2005/0242978 A1 Nov. 3, 2005

(30) Foreign Application Priority Data

Jun. 28, 2002 (DE) .............................. 102 28 942

(51) Int. Cl.
*H03M 3/00* (2006.01)

(52) U.S. Cl. ...................... 341/143; 341/155

(58) Field of Classification Search ................ 341/143, 341/131, 118, 120, 144, 155
See application file for complete search history.

(56) References Cited

U.S. PATENT DOCUMENTS

| | | | |
|---|---|---|---|
| 6,426,714 B1 * | 7/2002 | Ruha et al. .................. 341/143 |
| 6,445,318 B1 * | 9/2002 | Ruha et al. .................. 341/131 |
| 6,473,019 B1 * | 10/2002 | Ruha et al. .................. 341/143 |
| 6,744,392 B1 * | 6/2004 | Melanson .................... 341/143 |
| 6,768,437 B1 * | 7/2004 | Ruotsalainen et al. ...... 341/143 |
| 2002/0057214 A1 | 5/2002 | Brooks |

* cited by examiner

*Primary Examiner*—Lam T. Mai
(74) *Attorney, Agent, or Firm*—Peter Zawilski

(57) ABSTRACT

The circuit arrangement has a sigma-delta converter (2) for converting an analog input signal into a digital output signal. The sigma-delta converter (2) contains a loop filter, a comparator connected downstream of the latter and a feedback loop to feed the output signal back to the input signal. To reduce idle tones a dither signal is fed to the comparator by means of a dither-signal line (27.1). The dither signal is not however generated by a complex dither-signal generator. Instead, what is used as a dither signal is a signal that is available in the circuit but is not specifically generated for this purpose, e.g. an output signal from a second sigma-delta converter (2'). The circuit arrangement is thus simpler and less expensive than conventional circuit arrangements without its reduction of idle tones suffering.

10 Claims, 3 Drawing Sheets

CIRCUIT ARRANGEMENT AND METHOD FOR SIGMA-DELTA CONVERSION WITH REDUCED IDLE TONES

This application is a national phase of PCT/IB03/02886 filed on Jun. 19, 2003.

The present invention is concerned with the field of analog-to-digital (AD) converters and relates to a circuit arrangement having a sigma-delta converter and to a method of sigma-delta conversion in which idle tones are reduced.

A sigma-delta converter (also referred to as a sigma-delta modulator or an oversampling modulator) is an AD converter that converts any desired band-limited analog input signal into a digital 1-bit output signal. When this is done, the pulse density of the output signal is modulated by the input signal. Sigma-delta converters operate more accurately than multibit converters. At the present time they are used in most audio devices such as, for example, mobile telephones, CD players, etc.

The circuit diagram shown in FIG. 1 is that of an example formed by a sigma-delta converter 2 known from audio technology. Basically, a sigma-delta converter 2 is a feedback system having an input line 21 for an analog input signal to be converted (the useful signal), which line 21 terminates at a loop filter 22, having a quantizer 23 connected downstream of the loop filter 22, having an output line for the digital output signal 24 leading from the quantizer 23, and having a feedback loop 25 provided with a digital-to-analog (DA) converter 26. In the simplest case the loop filter 22 is an integrator but in the example shown here it is a fourth-order filter to give a higher resolution. A plurality of loop filters may be provided; the number of such filters gives the order of the sigma-delta converter 2. The sigma-delta converter 2 has for example four transconductance stages, the input voltage being converted into a current in each stage and the currents being summed at the input of the quantizer 23. The quantizer 23 is for example in the form of a comparator and is clocked by a carrier frequency that has to be far higher than the maximum frequency of the useful signal. The output signal is converted into an analog signal in the 1-bit DA converter 26 and is fed back into the loop filter 22 with a negative sign by the feedback loop 25.

When the input signal is low, and constant or only slowly varying, sigma-delta converters 2 may, due to their very principle, cause disruptions that are referred to as idle tones or idle noise. These disruptive tones or noise are perfectly audible to the human ear and are therefore undesirable.

To reduce the idle tones, it is known from the prior part for a stochastic dither signal to be superimposed on the input signal, to prevent any periodic behavior from occurring for brief periods at the output of the comparator 23 by ensuring that there are no such periodicities present in the input signal. This is disclosed in, for example, U.S. Pat. No. 5,144,308. A line 27 for a dither signal under this theory is also shown in FIG. 1. It terminates at the comparator 23 and the signal it carries can be summed with the signals coming from the loop filter 22. A generator for generating a random dither signal (not shown in the drawing) has to be provided in the circuit to generate the dither signal. The generator for generating the random dither signal forms a complex additional part of the circuit; it takes up space, makes the circuit more complex and in the end causes the costs to be higher.

It is therefore an object of the invention to provide a circuit arrangement having a sigma-delta converter and a method of sigma-delta conversion, in which idle tones are reduced but which at the same time do not suffer from the above disadvantages and in particular are less complex and less expensive than the solutions known from the prior art.

These are other objects are achieved by the circuit arrangement and method that are defined in the non-dependent claims. Advantageous embodiments are specified in the dependent claims.

The idea on which the invention is based is to dispense with a complex dither-signal generator and in place of it to use as the dither signal a signal that is available in the circuit but that is not generated specifically for this purpose. Suitable signals of this kind are present in the circuit arrangement. What is preferably used as a dither signal is an output signal from a second sigma-delta converter or an input signal to a finite impulse response (FIR) digital-to-analog converter. What are also suitable however are other signals that contain wide-band noise and no high-frequency tones or repetitions; what is preferably used is a noise-shaped signal. The circuit arrangement according to the invention is thus simpler and less expensive than conventional circuit arrangements without its reduction of idle tones suffering.

Hence, in the circuit arrangement according to the invention having a sigma-delta converter for converting an analog input signal into a digital output signal, the sigma-delta converter comprises a loop filter having a filter input to which an input line for the input signal is connected and having a filter output, a quantizer having a quantizer input that is connected to the filter output and having a quantizer output to which an output line for the output signal is connected, and a feedback loop to feed the output signal back to the input signal. The circuit arrangement has a dither-signal line that is suitable for additionally applying to the quantizer input, as a dither signal, a signal that is available in the circuit but is not specifically generated for this purpose.

The method according to the invention for the sigma-delta conversion of an analog input signal into a digital output signal comprises the following method steps:
(a) filtering of the input signal, thereby producing a filtered signal;
(b) adding together of the filtered signal and a dither signal, thereby producing a sum signal, what is used as the dither signal being a signal that is available in the circuit but is not specifically generated for this purpose;
(c) quantizing of the sum signal, thereby producing the output signal; and
(d) feeding of the output signal back to the input signal.

These and other aspects of the invention are apparent from and will be elucidated with reference to the embodiments described hereinafter.

Figure 1:
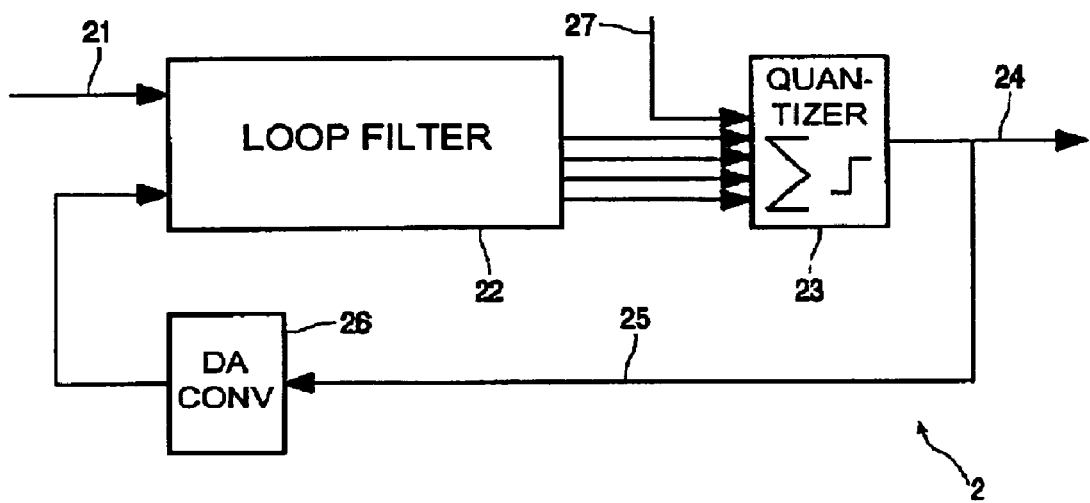
FIG. 1 is a block diagram of a sigma-delta converter as known from the prior art.
Figure 2:
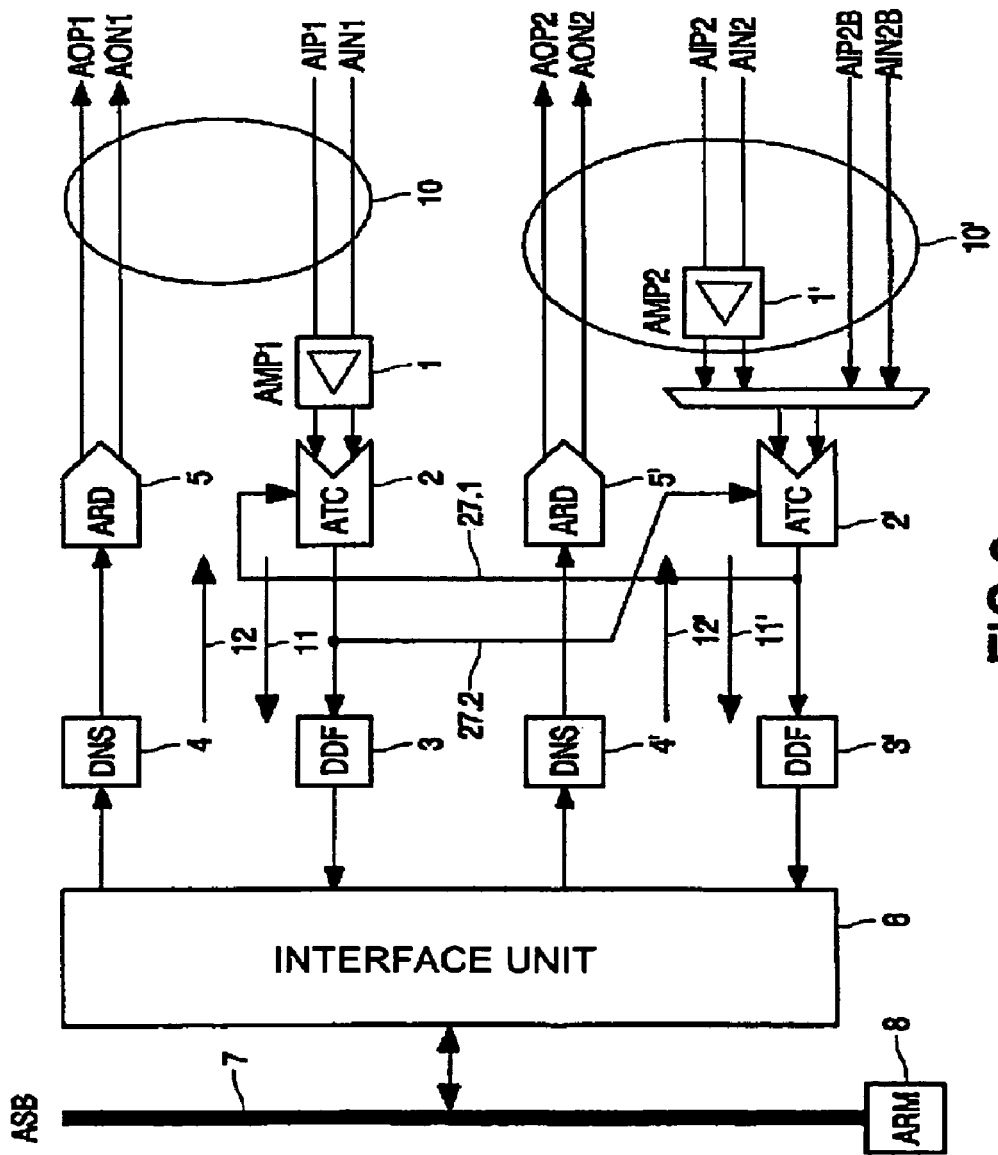
FIG. 2 is a block diagram of a first embodiment of the circuit according to the invention.
Figure 3:
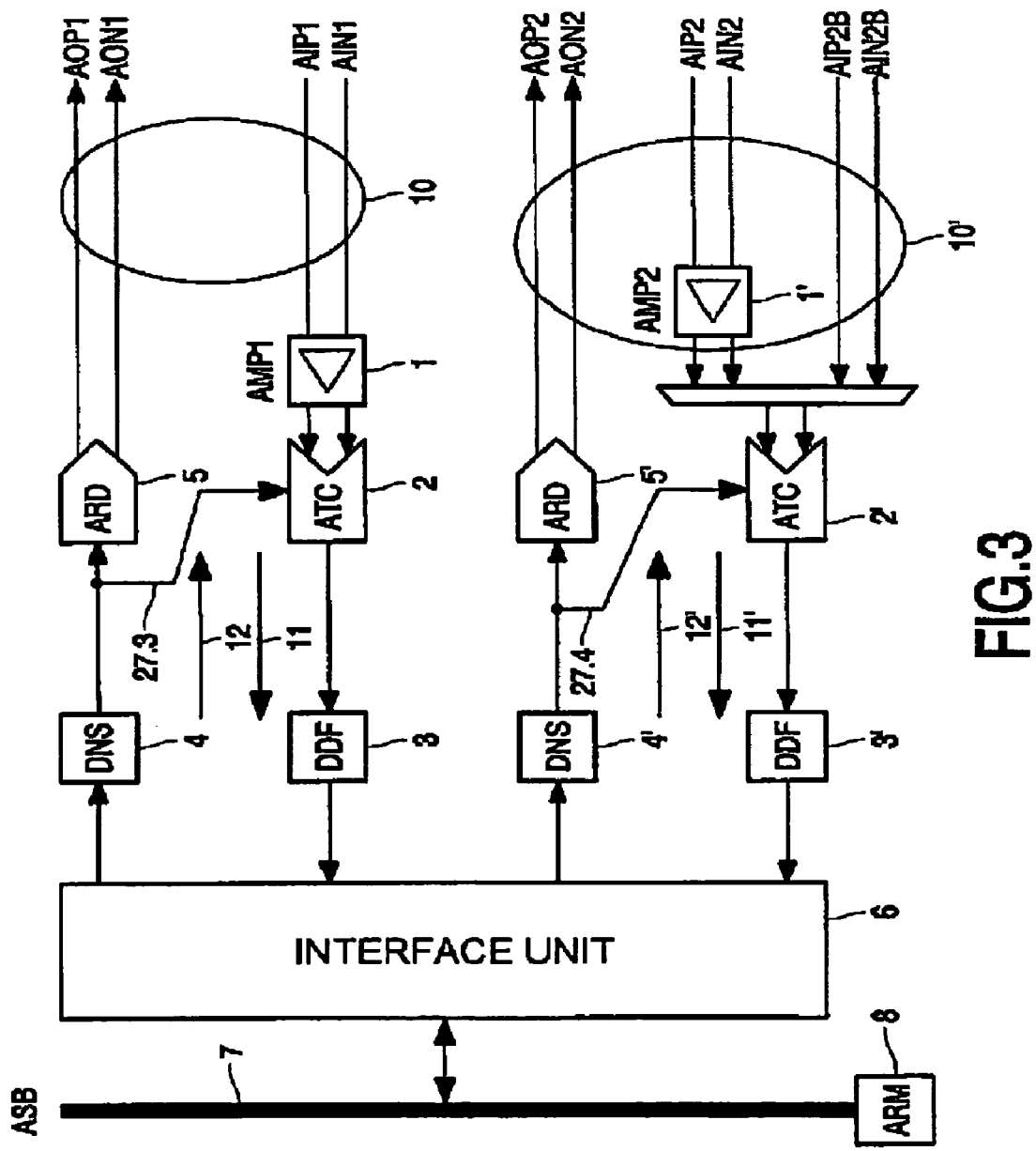
FIG. 3 is a block diagram of a second embodiment of the circuit according to the invention.

The circuits shown in FIGS. 2 and 3 relate to an example of an application in audio technology and can for example be used in a mobile telephone. What is involved is an encoder/decoder (codec) architecture for the speech band having two paths 10, 10'. Each path 10, 10' has an input channel 11, 11' having an AD converter 2, 2', and an output channel 12, 12' having a DA converter 5, 5'. The channels 11, 11' and 12, 12' each have a positive and a negative line, which are differentially operated and which form the input and output channels of respective paths. The input channel 11 of the first path 10 is connected to a microphone (not shown in the drawing) and the output channel 12 of the first path 10 is connected to a loudspeaker (not shown in the drawing). The second path 10' is connected to a telephone line (not shown in the drawing).

In FIGS. 2 and 3, the meanings of the reference letters and numerals are as follows:

AIP1 is the positive analog input line of the first path 10;
AIN1 is the negative analog input line of the first path 10;
AOP1 is the positive analog output line of the first path 10;
AON1 is the negative analog output line of the first path 10;
AIP2 is the positive analog input line of the second path 10';
AIN2 is the negative analog input line of the second path 10';
AOP2 is the positive analog output line of the second path 10';
AON2 is the negative analog output line of the second path 10;'
AMP is an amplifier 1, 1';
ATC is the sigma-delta converter (analog transmit converter) 2, 2';
DDF is a digital decimation filter 3, 3', i.e. a low-pass filter in which the sampling frequency is reduced and the resolution in bits increased (e.g. 1 bit @ 1 MHz to 16 bits @ 32 kHz);
DNS is a digital noise shaper 4, 4';
ARD is an analog receive DA converter 5, 5', preferably a finite impulse response (FIR) digital-to-analog converter;
ASB is an ARM system bus, i.e. a digital communications bus 7;
ARM is a processor (advanced RISC machine) 8.

The processor 8 controls the AD converters 2, 2' and the DA converters 5, 5' via the bus 7. It filters the various signals and combines them with one another. Inserted between the bus 7 and the converters 2, 2' and 5, 5' is a buffer and interface unit 6.

In a first embodiment of the invention that is shown in FIG. 2, what is used as the dither signal that is needed for the first sigma-delta converter 2 is the output signal from the second sigma-delta converter 2'. The dither signal is channeled off at the output of the second sigma-delta converter 2' and fed via a first dither-signal line 27.1 to the comparator of the first sigma-delta converter 2. If desired the frequency of the signal can be reduced upstream of the comparator, e.g. divided by two or four. Conversely, what may be used as the dither signal that is needed for the second sigma-delta converter 2' may of course be the output signal from the first sigma-delta converter 2, for which purpose a second dither-signal line 27.2 is provided. It is of course a prerequisite for the implementation of this embodiment that the circuit arrangement contains at least two sigma-delta converters 2, 2'.

In a second embodiment of the invention that is shown in FIG. 3, what is used as the dither signal that is needed for a sigma-delta converter 2 situated in an input channel 11 of a path 10 is an input signal to the finite impulse response (FIR) digital-to-analog converter 5 in the output channel 12 of the same path 10. This signal is preferably noise-shaped beforehand, by means of a digital noise-shaping filter 4 for example. Only high-frequency components or the complete signal can be used as a dither signal. The dither signal is channeled off at the input to the FIR digital-to-analog converter 5 and fed to the comparator of the sigma-delta converter 2 via a third dither-signal line 27.3. Any low-frequency components that may be present in the dither signal are not a nuisance because the comparator input of the sigma-delta converter 2 acts as a high-pass filter and filters components of this kind out of the dither signal. Further sigma-delta converters 2' in the circuit arrangement may be supplied with a dither signal in a similar way via further dither-signal lines 27.4. In contrast to the first embodiment, it is not necessary in this second embodiment for a plurality of sigma-delta converters to be present in the circuit arrangement.

Thanks to the invention, it is possible for circuit arrangements, particularly for audio technology, to be implemented that have a sigma-delta converter and in which idle tones are reduced, but which are low in complexity and inexpensive.

The invention claimed is:

1. A circuit arrangement having a sigma-delta converter (2) for convening an analog input signal into a digital output signal, wherein the sigma-delta converter (2) comprises a loop filter (22) having a filter input to which an input line (21) for the input signal is connected and having a filter output, a quantizer (23) having a quantizer input that is connected to the filter output and having a quantizer output to which an output line (24) for the output signal is connected, and a feedback loop (25) to feed the output signal back to the input signal, and the circuit arrangement has a dither-signal line (27) that is suitable for additionally applying to the quantizer input, as a dither signal, a signal tat is available in the circuit without a separate dither generator.

2. A circuit arrangement as claimed in claim 1, wherein the circuit comprises a second sigma-delta converter (2') having a second output line (24'), and the dither-signal line (27.1) connects the second output line (24') to the quantizer input of the first sigma-delta converter (2).

3. A circuit arrangement as claimed in claim 1, wherein the circuit arrangement comprises a digital-to-analog converter (5), preferably an FIR digital-to-analog converter, and the dither-signal line (27.3) connects an input line of the digital-t-analog converter (5) to the quantizer input of the first sigma-delta convener (2).

4. A circuit arrangement as claimed in claim 1, wherein the circuit arrangement has means (4) for noise shaping that are connected upstream of the dither-signal line (27.3).

5. A circuit arrangement as claimed in claim 1, wherein the quantizer (23) comprises a comparator.

6. A circuit arrangement as claimed in claim 1, wherein the feedback loop (25) comprises a digital-to-analog converter (26).

7. A method for the sigma-delta conversion of an analog input signal into a digital output signal comprising the following method steps:
(a) filtering of the input signal, thereby producing a filtered signal;
(b) adding together of the filtered signal and a dither signal, thereby producing a sum signal, what is used as the dither signal being a signal that is available in the circuit but is not specifically generated for this purpose;
(c) quantizing of the sum signal, thereby producing the output signal; and
(d) feeding-back of the output signal to the input signal.

8. A method as claimed in claim 7, wherein an output signal obtained by the sigma-delta conversion of a different input signal is used as the dither signal.

9. A method as claimed in claim 7, wherein an input signal to a digital-to-analog converter (5), preferably an FIR digital-to-analog converter, is used as the dither signal.

10. A method as claimed in claim 7, wherein a signal containing wide-band noise, preferably a noise-shaped signal, is used as the dither signal.

* * * * *